United States Patent
Ahn et al.

(10) Patent No.: US 7,414,204 B2
(45) Date of Patent: Aug. 19, 2008

(54) DISPLAY DEVICE AND HEAT DISSIPATING MEANS THEREFOR

(75) Inventors: Joong-Ha Ahn, Suwon-si (KR); Myoung-Kon Kim, Suwon-si (KR)

(73) Assignee: Samsung SDI Co., Ltd., Suwan-si (KR)

( * ) Notice: Subject to any disclaimer, the term of this patent is extended or adjusted under 35 U.S.C. 154(b) by 0 days.

(21) Appl. No.: 10/969,508

(22) Filed: Oct. 19, 2004

(65) Prior Publication Data
US 2005/0093429 A1    May 5, 2005

(30) Foreign Application Priority Data
Oct. 29, 2003 (KR) ............... 10-2003-0075977
Apr. 29, 2004 (KR) ............... 10-2004-0029980

(51) Int. Cl.
*H05K 7/02* (2006.01)
(52) U.S. Cl. ............ 174/541; 174/560; 313/238; 361/681
(58) Field of Classification Search ........... 174/541, 174/548, 560; 313/238; 361/681
See application file for complete search history.

(56) References Cited

U.S. PATENT DOCUMENTS

| | | | |
|---|---|---|---|
| 6,686,536 B2 * | 2/2004 | Tone et al. | 174/389 |
| 6,703,702 B2 | 3/2004 | Inoue et al. | |
| 6,965,191 B2 * | 11/2005 | Koike et al. | 313/112 |
| 2005/0174024 A1 * | 8/2005 | Hori et al. | 313/112 |
| 2005/0200264 A1 * | 9/2005 | Kawanami et al. | 313/479 |

FOREIGN PATENT DOCUMENTS

| | | |
|---|---|---|
| CN | 1402319 | 3/2003 |
| JP | 09-127541 | 5/1997 |
| JP | 2001-352022 | 12/2001 |
| JP | 2003-115568 | 4/2003 |
| KR | 2000-0013362 | 3/2000 |
| KR | 2002-0021481 | 3/2002 |
| KR | 2002-0030188 | 4/2002 |

OTHER PUBLICATIONS

Patent Abstracts of Japan for Publication No. 2003-115568; Date of publication of application Apr. 18, 2003, in the name of Kawada Toyoshi et al.
Patent Abstracts of Japan for Publication No. 2001-352022; Date of publication of application Dec. 21, 2001, in the name of Inoue Koichi et al.

(Continued)

*Primary Examiner*—Hung V. Ngo
(74) *Attorney, Agent, or Firm*—Christie, Parker & Hale, LLP (57) ABSTRACT

A display device including a display panel, a chassis base connected to the plasma display panel, the chassis base supporting the plasma display panel, and a flexible printed circuit having a driver integrated circuit thereon installed on the chassis base while being pressed by a protective plate. A step structure is formed on the chassis base where the flexible printed circuit is attached. Furthermore, the flexible printed circuit area where the driver integrated circuit is placed may be in contact with a heat dissipating material located in an accommodating portion formed in the chassis base.

15 Claims, 8 Drawing Sheets

OTHER PUBLICATIONS

Patent Abstracts of Japan for Publication No. 09-127541; Date of publication of application May 16, 1997, in the name of Kanatsu Tsutomo.

Korean Patent Abstracts, Publication No. 1020000013362 A, dated Mar. 6, 2000, in the name of Su Yong Lee.

Korean Patent Abstracts, Publication No. 1020020021481 A, dated Mar. 21, 2002, in the name of Yeong Hwa Song.

Korean Patent Abstracts, Publication No. 1020020030188 A, dated Apr. 24, 2002, in the name of Jae Hong Jun.

* cited by examiner

DISPLAY DEVICE AND HEAT DISSIPATING MEANS THEREFOR

CROSS-REFERENCE TO RELATED APPLICATION

The present application claims priority to and the benefit of Korean Patent Application Nos. 10-2003-0075977 filed on Oct. 29, 2003 and 10-2004-0029980 filed on Apr. 29, 2004, both applications filed in the Korean Intellectual Property Office, the entire content of which are incorporated by reference herein.

BACKGROUND OF THE INVENTION (a) Field of the Invention

The present invention relates to a display device, and in particular, to a display device that can dissipate heat efficiently from a tape carrier package (TCP) driver integrated circuit (IC) installed on the chassis base that applies an address voltage to a display panel from a driving circuit board.

(b) Description of the Related Art

One example of a commonly used display device is a plasma display device. It is well known that a plasma display device uses plasma generated by gas discharge to display an image on a plasma display panel. Conventionally, in the plasma display device, a flexible printed circuit (FPC) electrically connects electrodes printed on the plasma display panel to a driving circuit. The FPC has an IC that applies an address voltage to form a wall voltage selectively in each pixel in accordance with signals controlled by the driving circuit.

For example, widely used structures using the FPC and the IC to apply the voltage are a chip on board (COB) structure in which the IC is installed on a printed circuit board (PCB), and a chip on film (COF) structure in which the IC is installed on a film composing the FPC. Another structure used recently and more frequently is the TCP, which is small and less expensive.

A COF, COB, or TCP installed on the chassis base produces electromagnetic interference (EMI) as well as a substantial amount of heat. The heat is produced because the gas discharge occurs at least 8 times during 1/60 second (1 TV field), in order to produce more than 256 gradations in the plasma display panel.

Therefore, a reinforcing plate is installed in the COB or COF to reinforce its structure and to fix the COB or COF on the chassis base. The reinforcing plate also plays a role of efficiently dissipating heat generated in the IC to the outside.

With the TCP, by contrast, a heat dissipating plate (or a heat sink) connected to the TCP is installed on the chassis base to dissipate heat from the driver IC to the air.

The heat dissipating plate, installed with the TCP on the chassis base, presses the driver IC to the chassis base, with a stopper consisting of special means placed between the heat dissipating plate and the chassis base to maintain a predetermined space therebetween.

In mass production of the plasma display device, however, the manufacturing tolerance of the chassis base can sometimes cause a non-perfect surface in terms of flatness, where the TCP is attached. In this case, the driver IC may be broken by the heat dissipating plate abnormally pressing the driver IC because the predetermined space is not maintained between the heat dissipating plate and the chassis base.

In addition, the heat dissipating plate in this structure can crush the FPC of the TCP when the heat dissipating plate is fastened with uneven forces of screws. The uneven forces of the screws cause the heat dissipating plate to twist which results in tearing of the FPC.

SUMMARY OF THE INVENTION

In accordance with the present invention, embodiments of a display device a provided which securely protect the TCP regardless of the conditions of both the chassis base where the TCP is installed and the heat dissipating plate pressing the TCP.

According to an embodiment of the present invention, the display device comprises a display panel, a chassis base positioned parallel to the display panel, the chassis base supporting the display panel, an FPC placed in the back of the chassis base, the FPC having a driver IC thereon and extending to the electrodes of the plasma display panel for the electrical connection, and a protective plate placed in the vicinity of the FPC, pressing the FPC to the chassis base. A step structure is formed on the chassis base where the FPC is placed.

The driver IC, facing the top of the step structure, is in contact with the top surface of the step structure. The step structure may be formed as a single body with the chassis base or as a separate structure to be installed on the chassis base. Further, the step structure may have a protruded area facing opposite the display panel.

Additionally, a heat dissipating sheet may be placed between the FPC and the protective plate. The driver IC is packed in the TCP and installed on the FPC.

A damping means may be also placed between the FPC and the step structure. The damping means is located in an accommodating portion that is formed on the step structure. The driver IC, facing the damping means, is in contact with the damping means. Here, the step structure may be formed as a single body with the chassis base or as a separate structure to be installed on the chassis base. The step structure is formed to have a protruded area facing the plasma display panel and a protruded area in a part in the opposite direction to the display panel.

In accordance with another embodiment of the present invention, a heat dissipating material placed in the accommodating portion of the chassis base is in contact with the FPC having the driver IC in the display device.

The accommodating portion may be a cavity formed on the chassis base itself, or a cavity formed on a reinforcing means installed in the chassis base. The reinforcing means may be made of a solid material having high thermal conductivity, such as aluminum, steel, or copper.

The heat dissipating material is in a gel-phase and applies pressure to the driver IC. Furthermore, a cover plate may be installed to the chassis base.

DETAILED DESCRIPTION

Figure 1:
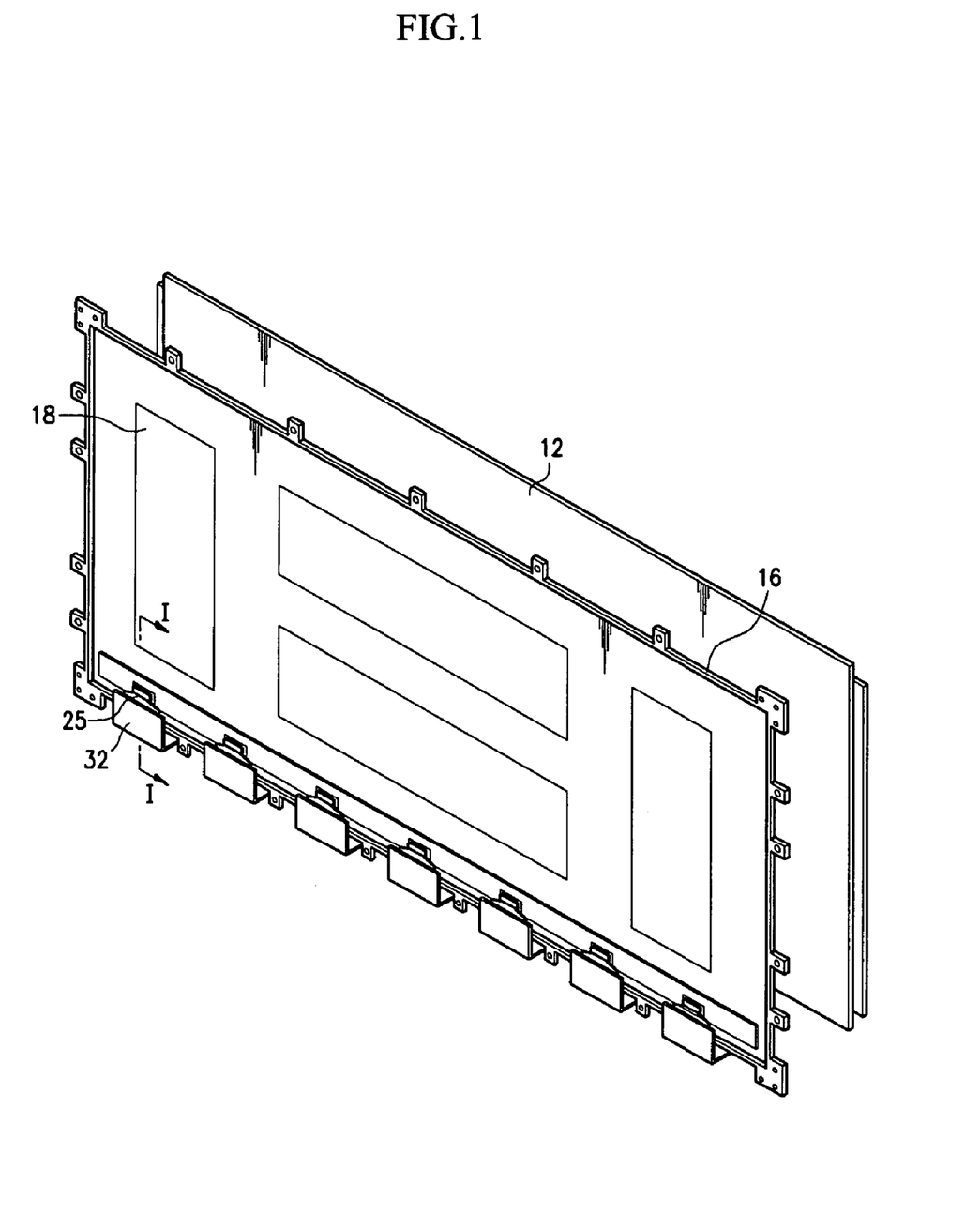
FIG. 1 is a perspective view of a display device according to a first embodiment of the present invention.
Figure 2:
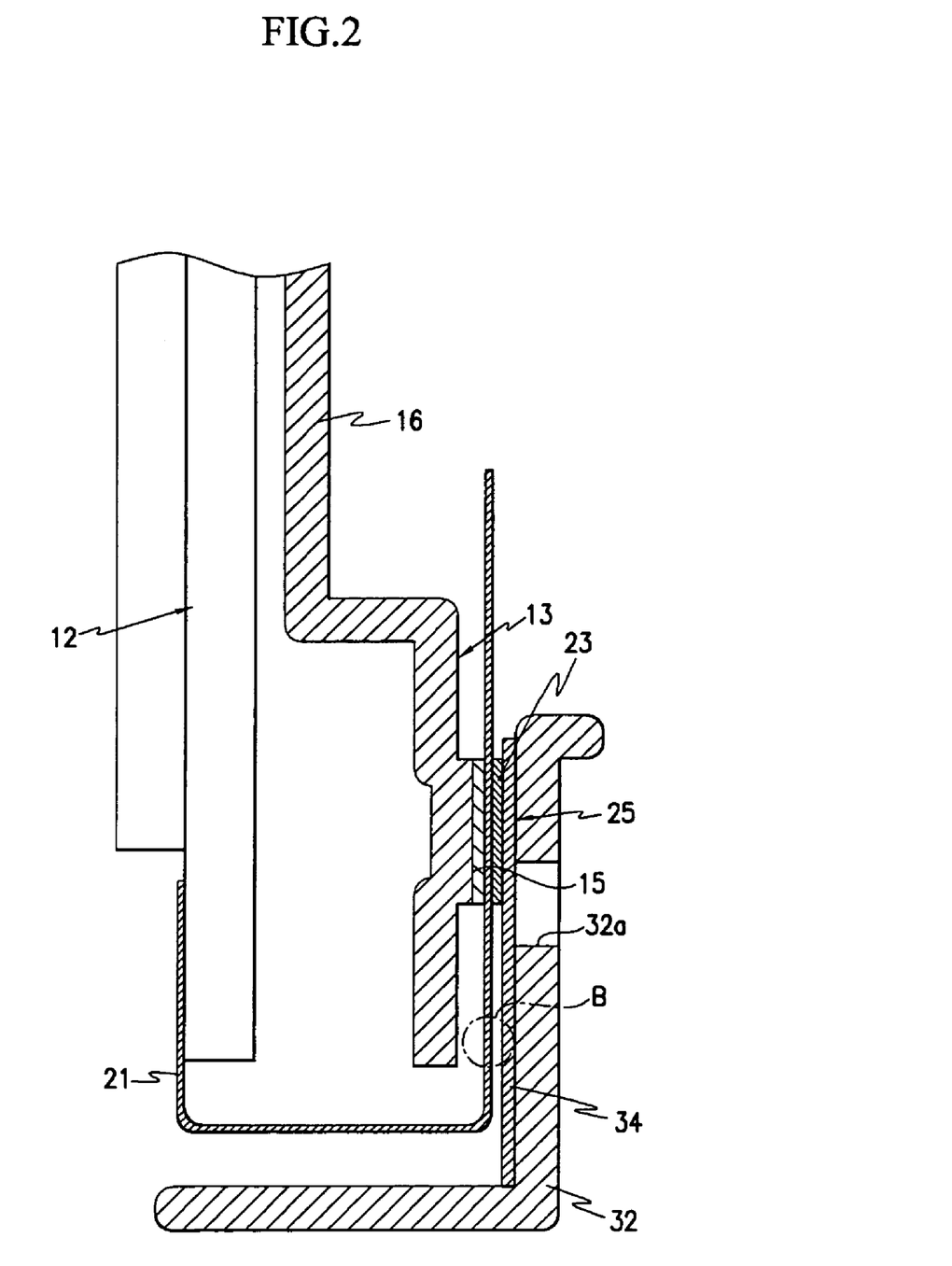
FIG. 2 is a sectional side view taken along line I-I in FIG. 1.

As shown in FIGS. 1 and 2, a display device in accordance with one embodiment of the present invention includes a PDP 12 and a chassis base 16. The PDP 12 is attached by an adhesive means such as a double-sided tape on one side of the chassis base 16, and a driving board 18 for driving the PDP 12 is attached by screw connections on the other side of the chassis base 16. The chassis base 16 is placed substantially parallel to the PDP 12, and a thermal conduction medium (or heat dissipation sheet, not shown) may be positioned therebetween. A front cover (not shown) is placed at the outside of the PDP 12, and a back cover (not shown) is placed at the outside of the chassis base 16. Combining all of the above list components constitutes an exemplary display device set.

The PDP 12 and the driving board 18 are electrically connected via an FPC 21, through which the PDP 12 receives electrical signals required for driving from the driving board 18.

A driver IC 23, installed on the FPC 21, selectively applies a voltage to the electrodes of the PDP 12 in accordance with the signals controlled by the driving board 18. In the present embodiment, the driver IC 23 is packed in the TCP 25 and is connected to both the driving board 18 and the PDP 12.

In more detail of the TCP 25 structure, the FPC 21, as shown in FIG. 2, is installed to the chassis base 16 by connection means such as screws while being pressed to the driver IC 23 by the protective plate (or heat dissipating plate) 32 placed at the rear of the FPC.

For this purpose, holes 32a for the screws are formed in the protective plate 32 and at the locations in the chassis base 16 corresponding to the holes 32a.

On the other hand, a step structure as shown in FIG. 2, is formed in a section 13 of the chassis base 16 where the FPC 21 is attached. The step structure in the present embodiment has a protruded area 15 facing opposite the PDP 12. The driver IC 23, facing the topmost part of the step structure, is in contact with the topmost surface thereof.

When the FPC 21 is installed with the protective plate 32 on the chassis base 16 in accordance with this structure, the FPC 21 circumvents the chassis base 16 and, due to the step structure, is given a clearance as indicated by B in the drawing.

This structure prevents the FPC 21 from being fractured by a slightly twisted protective plate 32 by uneven fastening of the protective plate 32 to the chassis base 16, or by an uneven surface of the FPC 21 attachment on the chassis base 16 resulting from thermal deformation thereof that occasionally occurs during the manufacturing process.

Moreover, this structure for connecting the FPC 21 is expected to increase the efficiency of heat dissipation from the driver IC 23 because only the driver IC 23 is in contact with the chassis base 16, providing more secure contact with a heat dissipating sheet 34 placed behind the driver IC 23.

Figure 3:
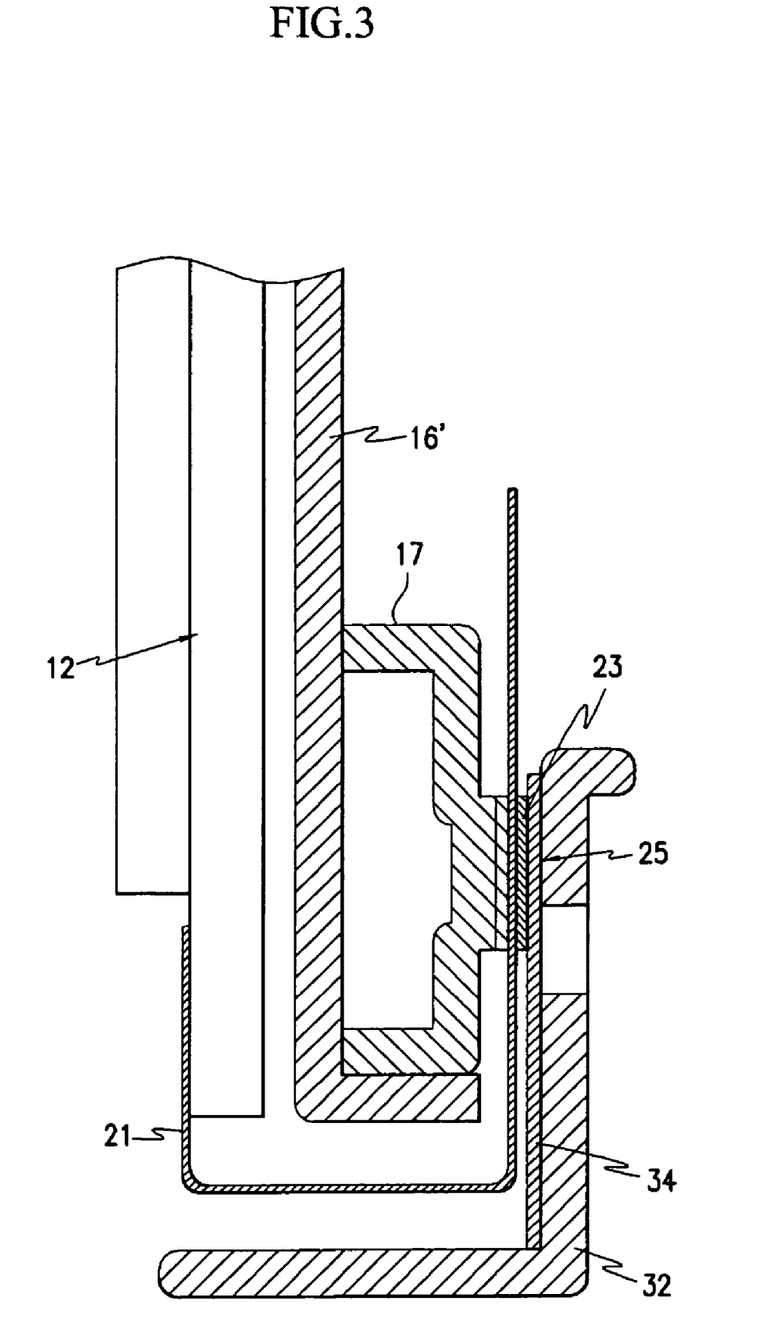
FIG. 3 is a partial sectional side view showing a modification of the first embodiment of the present invention.

The step structure of the chassis base 16 can be formed as a single body with the chassis base 16 itself as shown in FIG. 2, or as an embodiment having a separate structure 17 to be installed on the chassis base 16' as shown in FIG. 3.

Figure 4:
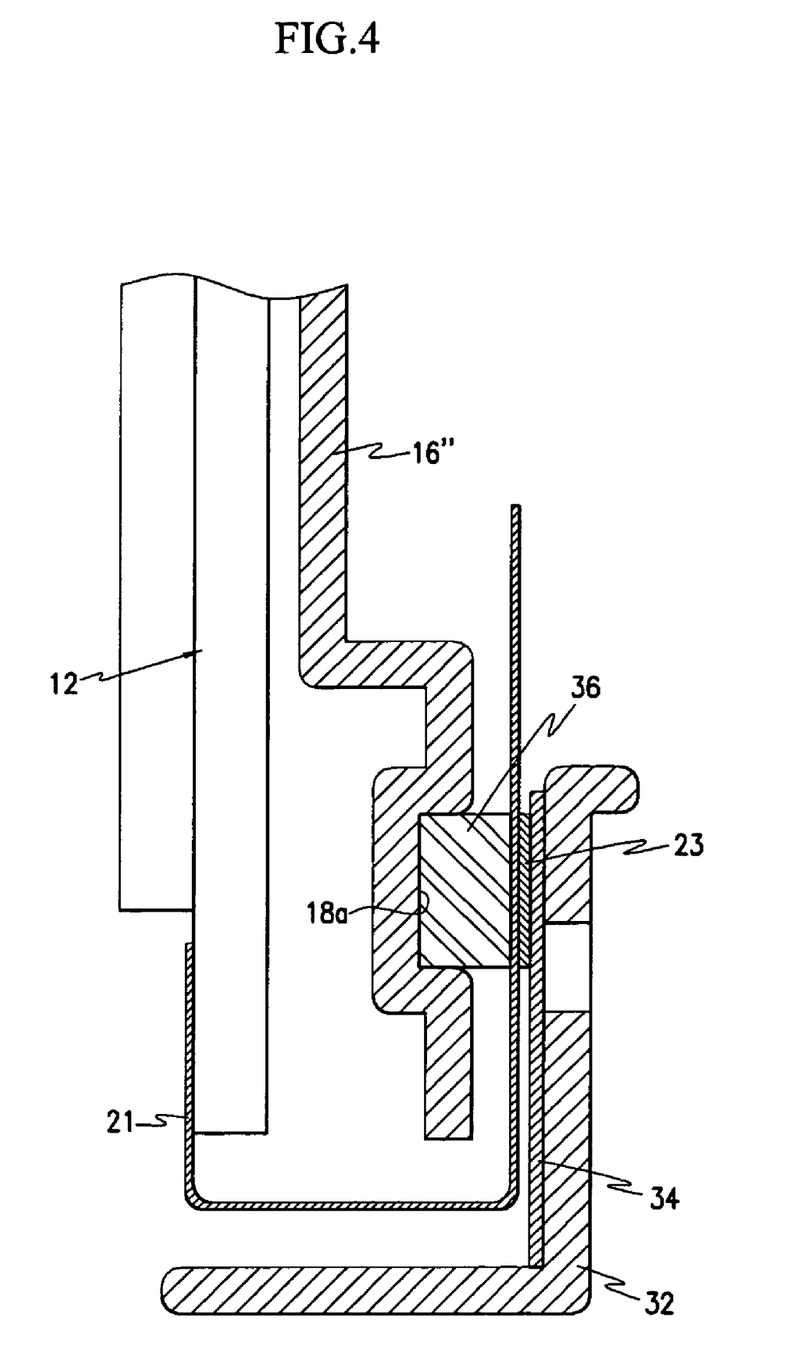
FIG. 4 is a partial sectional side view of the display device according to a second embodiment of the present invention.
Figure 5:
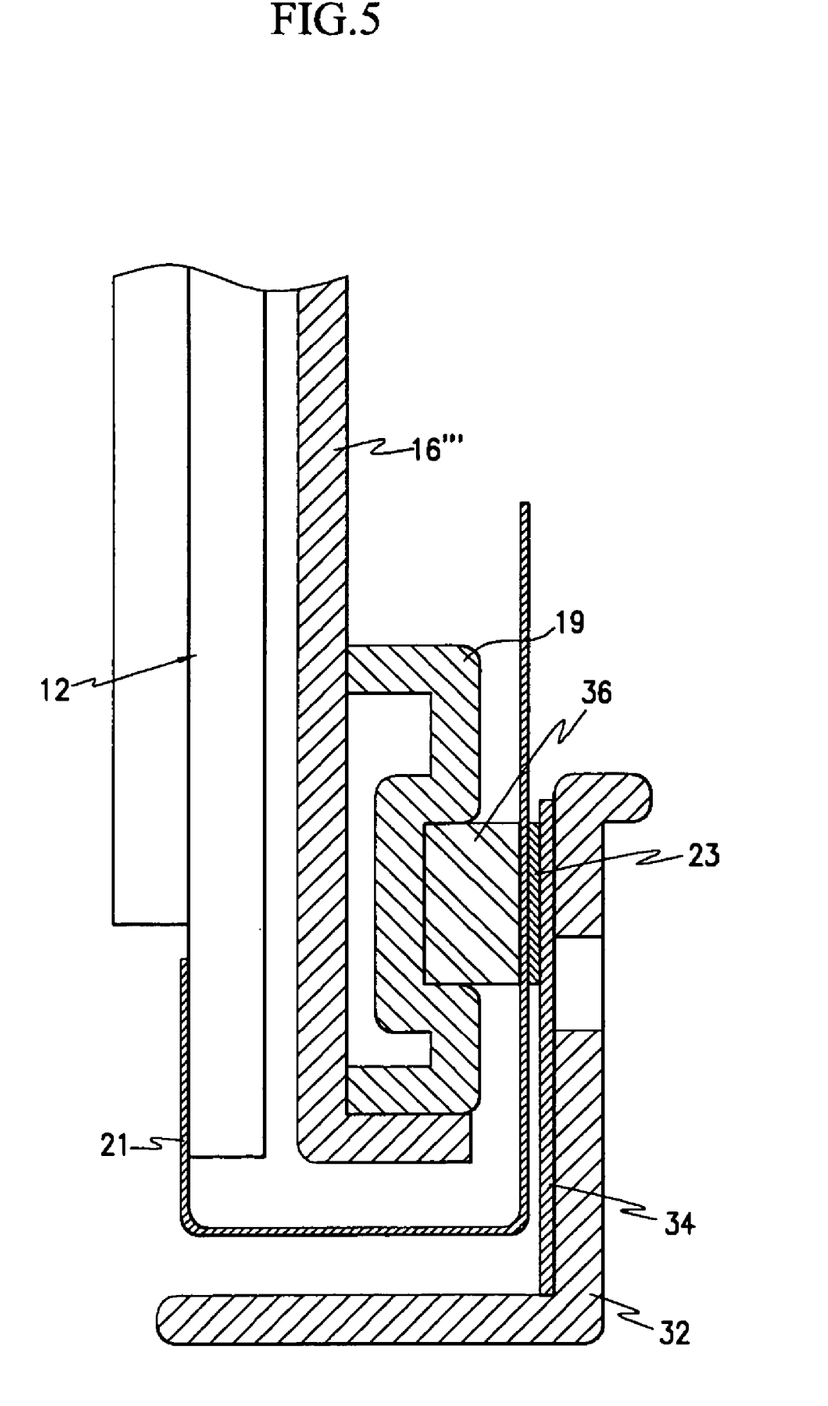
FIG. 5 is a partial sectional side view showing a modification of the second embodiment of the present invention.

FIG. 4 is a partial sectional side view of a display device according to a second embodiment of the present invention, and FIG. 5 is a partial sectional side view showing a modification of the second embodiment of the present invention.

Like the previous embodiment, the second embodiment adopts a step structure in the chassis base 16" and provides the structure to prevent damage of the FPC 21 of the TCP 25. At the same time, the structure increases the efficiency in the heat dissipation from the driver IC 23 by providing more contact pressure to the driver IC 23 while preventing damage thereof.

The step structure of the chassis base 16" in the present embodiment consists of a section 60 protruding toward the PDP 12 and a section 62 protruding in the opposite direction. A cavity-like accommodating portion 18a is formed in the step structure by this configuration, and an elastic damping means 36 is inserted therein. The thickness of the damping means 36 is preferably larger than the depth of the accommodating portion 18a.

In order for the driver IC 23 to be placed in contact with the damping means 36, the protective plate 32 pressing the driver IC 23 is attached to the chassis base 18 while the FPC 21 circumvents the chassis base 18. Because the driver IC 23 is in contact with the damping means 36, the damping means 36 may reduce the contact-pressure exerted on the driver IC 23 and prevent its fracture under the pressure of the protective plate 32.

In terms of the protective plate 32, this implies that a larger pressing force may be exerted on the driver IC 23. In the present embodiment, this can increase the efficiency of heat dissipation due to better contact of the driver IC 23 with the heat dissipating sheet 34 placed behind the driver IC 23.

For the aforementioned role, the step structure of the chassis base 18 is formed in a single body with the chassis base itself, as shown in FIG. 4. FIG. 5 shows a separate structure 19 to be attached to the chassis base 16''' for the aforementioned role.

Figure 6:
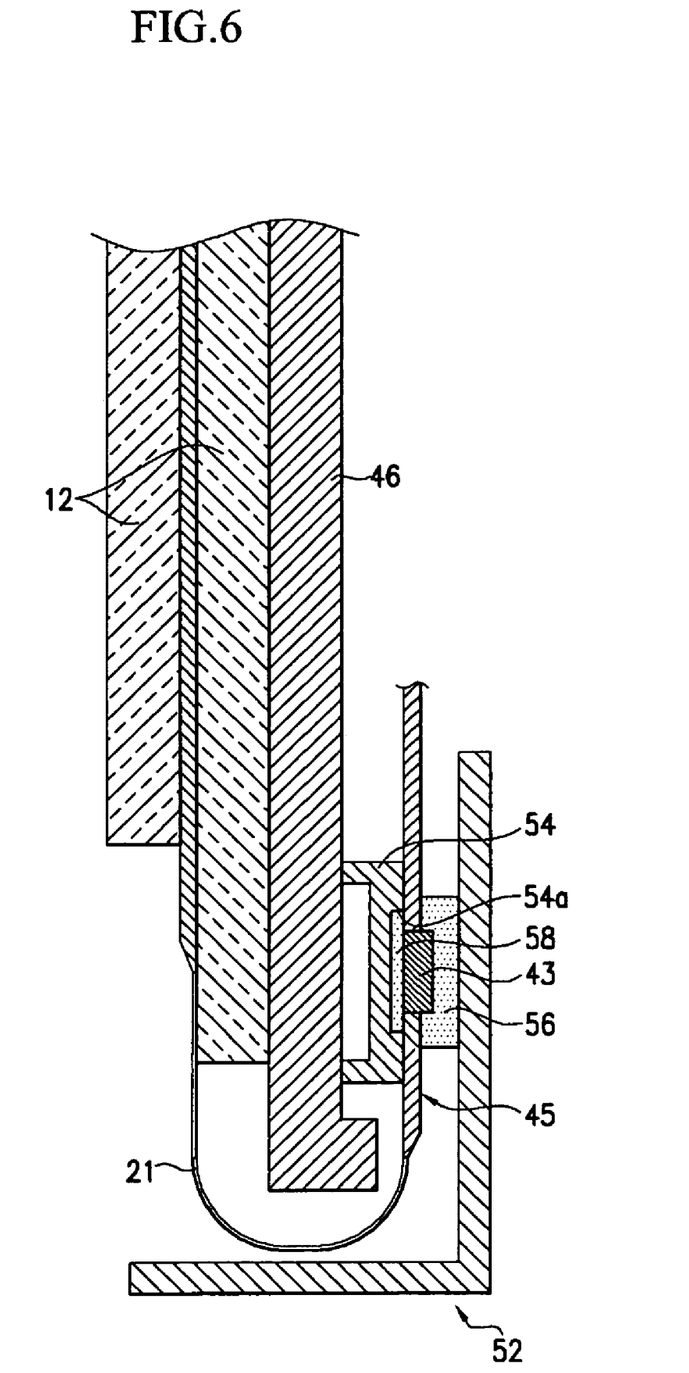
FIG. 6 is a partial sectional side view of the display device according to a third embodiment of the present invention.
Figure 7:
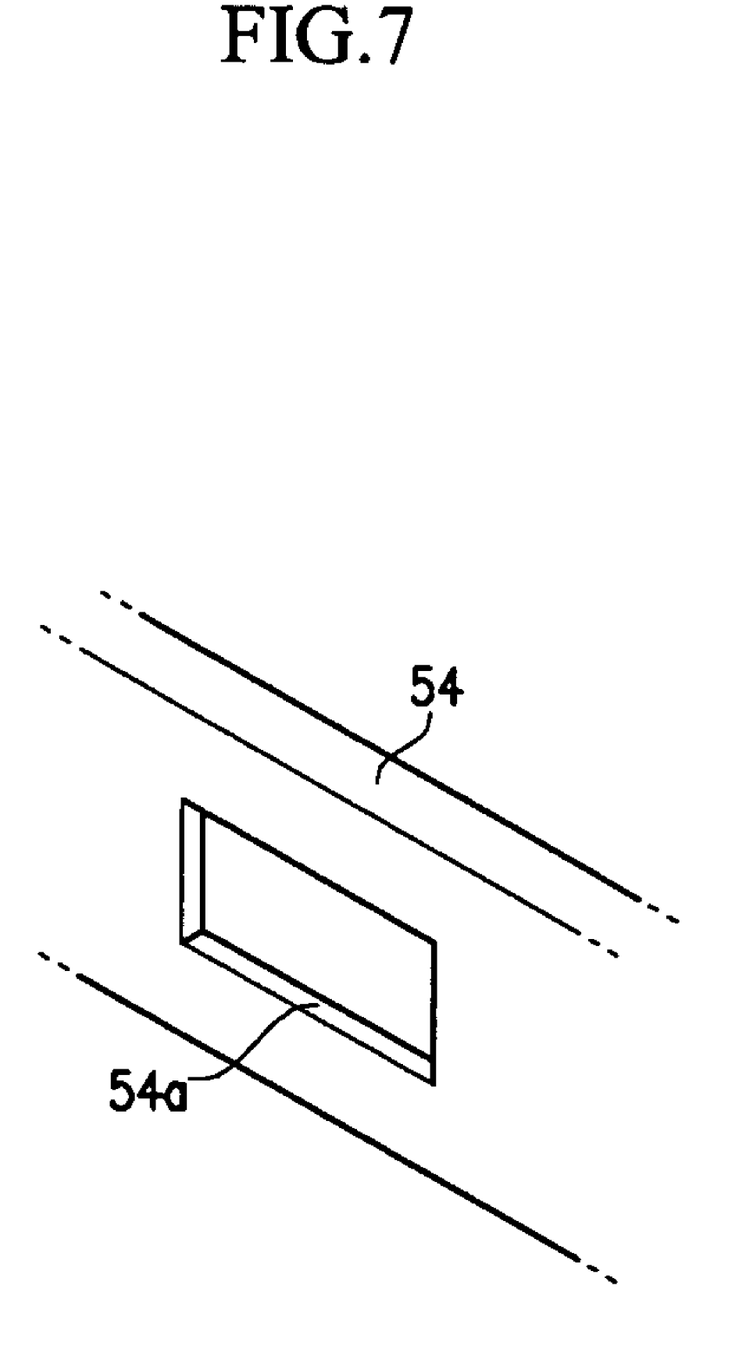
FIG. 7 is a perspective view of the accommodating portion for a heat dissipating material of the display device according to the third embodiment of the present invention.

FIG. 6 is a partial sectional side view of a display device according to a third embodiment of the present invention, and FIG. 7 is a perspective view of the accommodating portion for the heat dissipating material.

In addition, as displayed in FIG. 6, a reinforcing means 54, placed along the direction of the TCP 45 arrangement and between the TCP 45 and the chassis base 46, is attached by connection means such as a screw to the chassis base 46.

The reinforcing means 54 supports the TCP 45 and is made of a thermal conduction material such as aluminum, copper, or steel for better transfer of the heat generated from the TCP 45 to the chassis base 46.

For efficient heat dissipation from the TCP 45, a heat dissipating sheet 56 is also placed between the cover plate 52 and the TCP 45, and in particular, is centered to the area where the driver IC 43 is attached between the cover plate 52 and the TCP 45.

In accordance with the present invention, furthermore, a heat dissipation material 58 in a gel-phase is located in the accommodating portion 54a for the heat dissipating material 58 in the chassis base 46, and the FPC 21 area where the driver IC 43 placed is in contact with the heat dissipating material 58.

Figure 8:
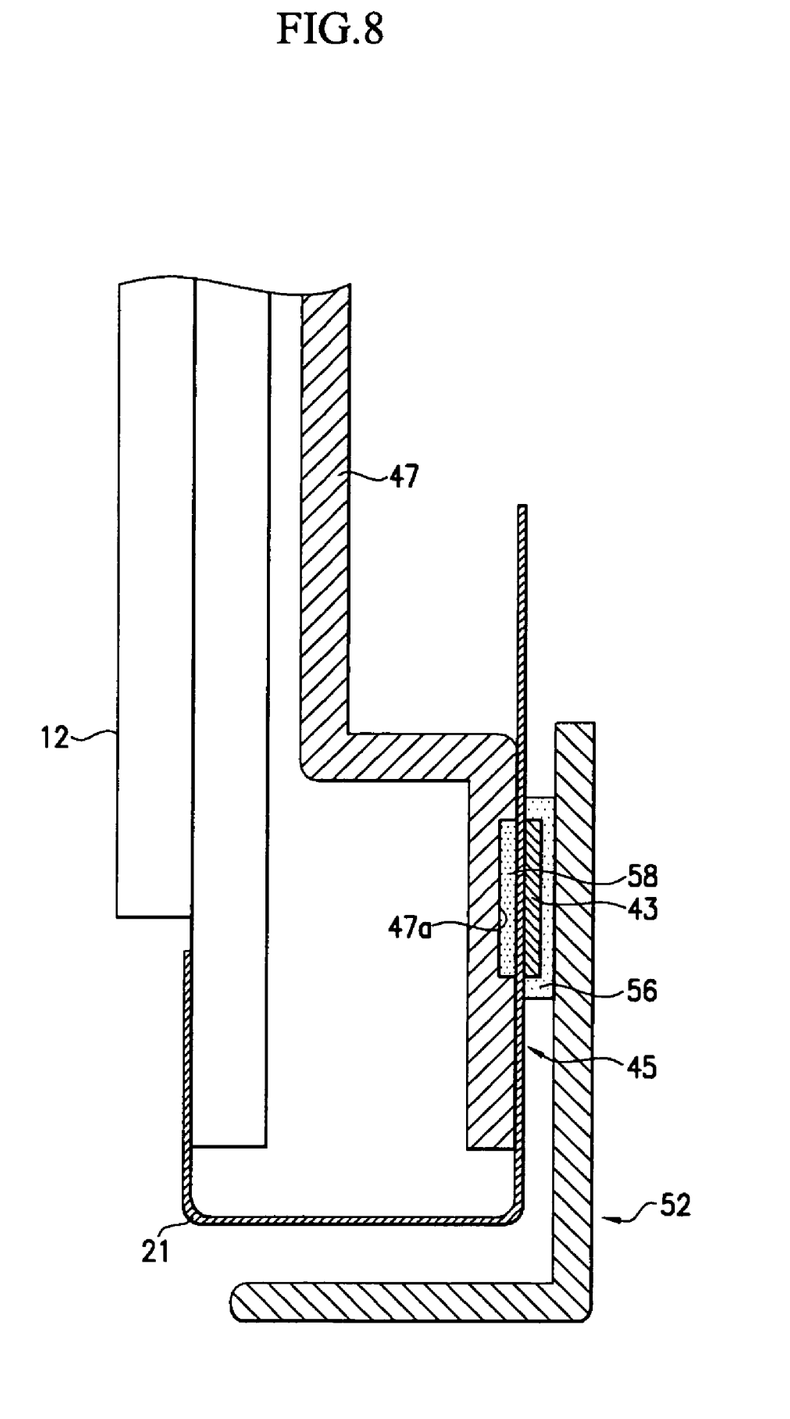
FIG. 8 is a partial sectional side view of the display device according to a fourth embodiment of the present invention.

The accommodating portion 54a for the heat dissipating material 58 can be formed into the shape of a cavity on the reinforcing means 54, as clearly shown in FIG. 7, or a cavity 47a on the chassis base 47 itself, as shown in FIG. 8.

When the TCP 45 is installed accordingly on the chassis base 47, the FPC 21 area where the driver IC 43 placed is in surface-contact with the heat dissipating material 58, and therefore, the efficiency of heat dissipation is improved over the prior art.

The increase in the efficiency of the heat dissipation makes it possible to use less force for attaching the TCP 45 to the chassis base 47 via the cover plate 52. Consequently, it can prevent fracture of the driver IC 43 of the TCP 45 under the pressure of the cover plate 52.

On the other hand, even in the case of a great pressing force from the cover plate 52, the heat dissipating material 58 placed behind the driver IC 43 may absorb the pressure to some extent so that the driver IC 43 may remain intact.

Moreover, since the TCP 45 is installed on the chassis base 46, 47 while it is in contact with the heat dissipating material 58 located in the accommodating portions 54*a*, 47*a*, it is possible to securely re-install the heat dissipation structure for the TCP 45 without re-spreading thermal grease on the attachment area of the driver IC 43. It may therefore improve the installation procedure for installing the TCP 45.

As explained hereinabove, a display device according to the present invention improves the structure of the chassis where the TCP is attached so that the area of the FPC of the TCP in contact with the chassis base and/or the protective plate is minimized, and thereby the driver IC of the TCP can be securely protected and the heat from the driver IC can be dissipated efficiently.

Although exemplary embodiments of the present invention have been described in detail hereinabove, it should be clearly understood that many variations and/or modifications of the basic inventive concept taught herein will appear to those skilled in the art to still fall within the spirit and scope of the present invention, as defined in the appended claims.

What is claimed is:

1. A display device comprising:
   a display panel comprising electrodes;
   a chassis base adjacent to the display panel, the chassis base supporting the display panel;
   a flexible printed circuit on a surface of the chassis base, the flexible printed circuit having a driver integrated circuit, the flexible printed circuit extending to the display panel for electrical connection between the driver integrated circuit and the display panel; and
   a protective plate pressing the flexible printed circuit to the chassis base,
   wherein a step structure is formed on the chassis base, the step structure protruding towards the flexible printed circuit where the flexible printed circuit is attached to the chassis base, the step structure creating a gap between the chassis base and the flexible printed circuit; and
   wherein the driver integrated circuit creates a gap between the flexible printed circuit and the protective plate.

2. The display device of claim 1, wherein the driver integrated circuit, facing a top of the step structure, is in contact with the top surface of the step structure.

3. The display device of claim 1, wherein the step structure is integral with the chassis base.

4. The display device of claim 1, wherein the step structure is a separate structure from the chassis base.

5. The display device of claim 1, wherein the step structure is a protruded area facing opposite the display panel.

6. The display device of claim 5, wherein a heat dissipating sheet is between the flexible printed circuit and the protective plate.

7. The display device of claim 1, wherein the driver integrated circuit is in a type carrier package.

8. The display device of claim 1, further comprising a damping means between the flexible printed circuit and the step structure.

9. The display device of claim 8, wherein the damping means is located in an accommodating portion that is formed on the step structure, and the driver integrated circuit facing the damping means is in contact with the damping means.

10. The display device of claim 8, wherein the step structure is formed as a single body with the chassis base itself.

11. The display device of claim 8, wherein the step structure is formed as a separate structure to be installed on the chassis base.

12. The display device of claim 8, wherein the step structure has a protruded area facing the display panel and a protruded area facing opposite the display panel.

13. The display device of claim 12, wherein a heat dissipating sheet is placed between the flexible printed circuit and the protective plate.

14. The display device of claim 8, wherein the driver integrated circuit is packed in the type carrier package and installed on the flexible printed circuit.

15. The display device of claim 1, wherein the display panel is a plasma display panel.

* * * * *